000
United States Patent [19]

Kryder

[11] 4,229,807
[45] Oct. 21, 1980

[54] CURRENT CONTROLLED DISK REPLICATOR

[75] Inventor: Mark H. Kryder, Yorktown Heights, N.Y.

[73] Assignee: International Business Machines Corporation, Armonk, N.Y.

[21] Appl. No.: 902,649

[22] Filed: May 4, 1978

[51] Int. Cl.² .............................................. G11C 19/08
[52] U.S. Cl. ........................................ 365/12; 365/34
[58] Field of Search .......................................... 365/12

[56] References Cited

U.S. PATENT DOCUMENTS

| 3,925,769 | 12/1975 | George | 365/12 |
| 4,079,359 | 3/1978 | Gergis | 365/12 |

OTHER PUBLICATIONS

IBM Technical Disclosure Bulletin-vol. 19, No. 7, Dec. 1976, pp. 2751-2752.

*Primary Examiner*—James W. Moffitt
*Attorney, Agent, or Firm*—Jackson E. Stanland

[57] ABSTRACT

A magnetic bubble domain chip having two levels of metallurgy fabricated in a single masking step and including a replicate type bubble generator. The bubble generator includes a magnetic disk which holds a seed domain during reorientation of a magnetic drive field in the plane of the magnetic bubble material, and a conductor located at the leading, i.e., cutting, edge of the magnetic disk. Current in the conductor is used to assist the splitting operation whereby a new domain is split from the stretched seed domain. The conductor includes a first portion having a relatively wide cross-section where most of the current flows through a highly conductive material, such as gold. In the area of the generator, the conductor is narrow and the current path is through the magnetic material comprising the disk. Use of the magnetic material as a conductor path reduces problems due to electromigration and the generator is particularly suitable for use in providing magnetic bubble domains having diameters 2 microns and less.

17 Claims, 18 Drawing Figures

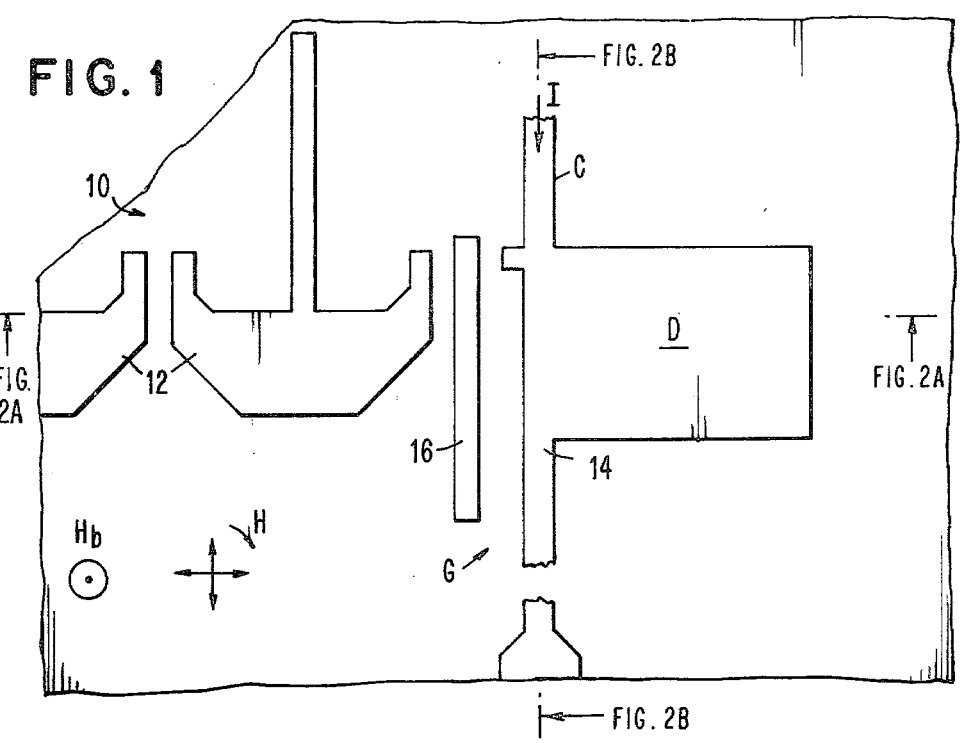
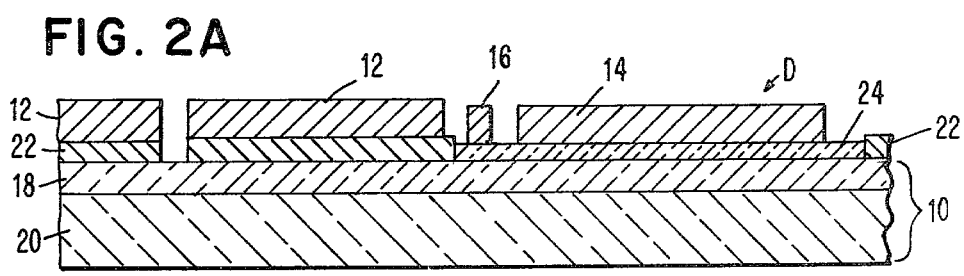
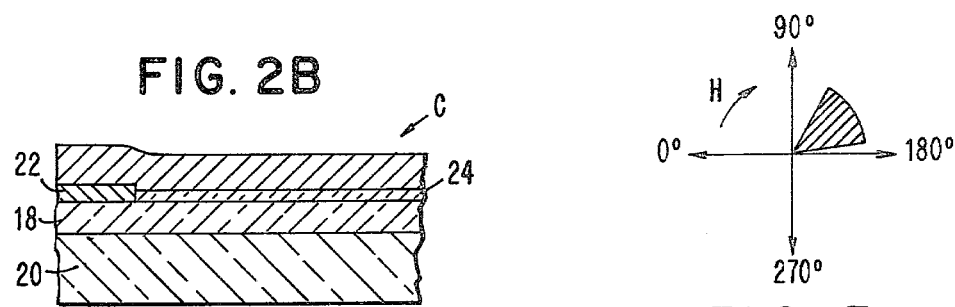

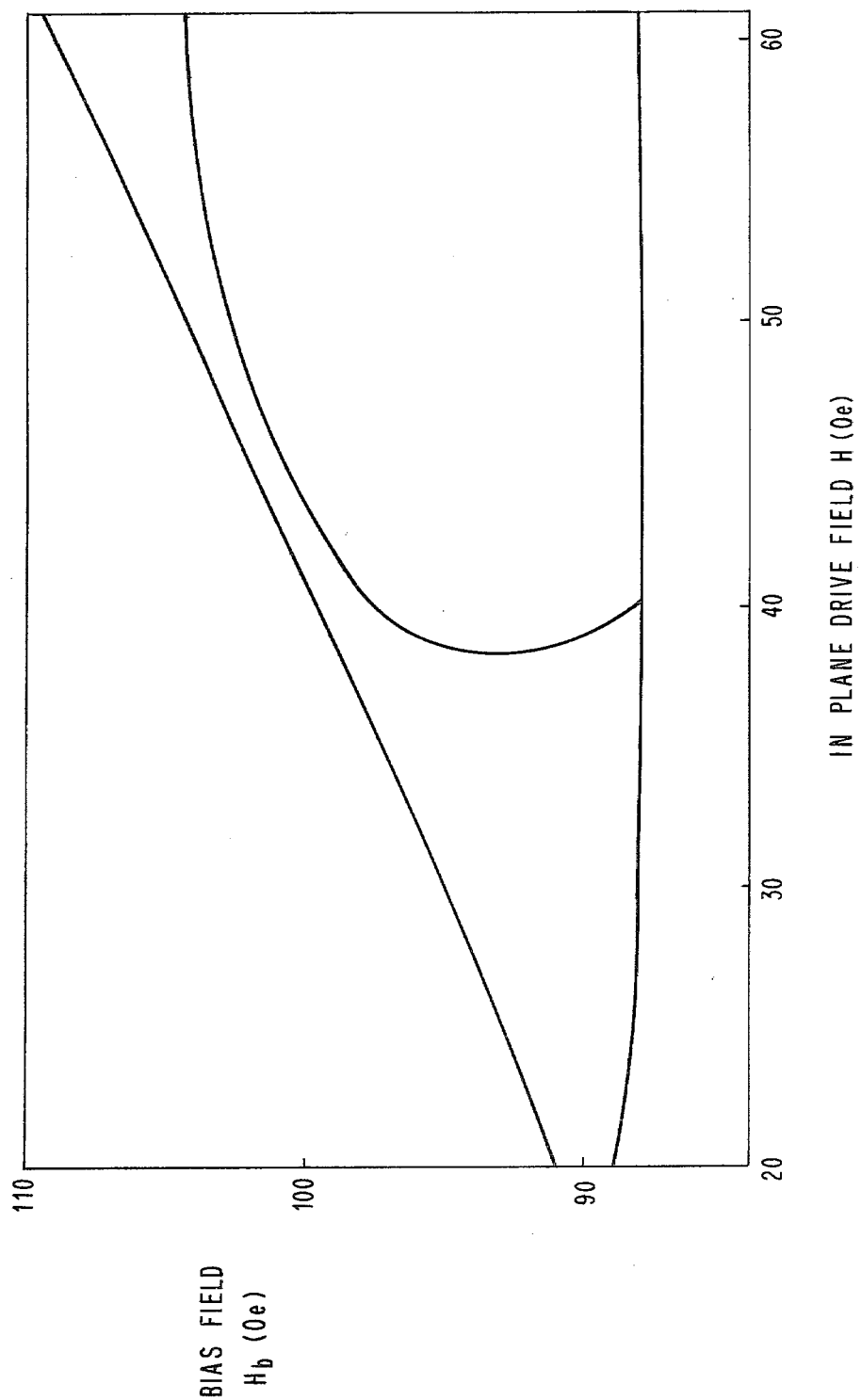

CURRENT CONTROLLED DISK REPLICATOR

DESCRIPTION

Technical Field

This invention relates to magnetic bubble domain chips having a current controlled disk replicator for generating very small bubble domains, and more particularly to a single masking level disk generator in which current flows through the magnetic disk during replication of a stretched seed domain thereon.

BACKGROUND ART

In a complete magnetic bubble domain chip, many device functions must be performed. For instance; bubble domains have to be generated, stored, read, transferred between different storage positions, and annihilated. In particular, bubble domain generators are generally of two types: nucleators and replicators. In the first of these, bubble domains are created in a magnetic medium capable of supporting the bubble domains, by providing sufficient input energy to reverse the direction of magnetization of the magnetic medium in a localized area of the medium. In the second type of domain generator, seed bubble domains are split into parts, the split portions being new bubble domains which can be used in a bubble domain device. The seed domain is generally retained at its location in order to be stretched and split again for producing yet another new bubble domain.

Replicator-type bubble domain generators have been improved in the art and now use combinations of magnetic elements and/or current carrying conductors to assist the replicate function. For example, current-controlled disk replicators are described in U.S. Pat. Nos. 3,611,311 and 3,735,370. The principle of operation of this type of replicator is the same as the basic disk replicator described in U.S. Pat. No. 3,555,527. However, the magnetic field produced by current in an associated conductor is used to enhance the splitting of the seed domain.

In the fabrication of current controlled replicators, designs have been provided using a magnetically soft material, such as permalloy, for both the magnetic propagation elements and for the current carrying conductor. Such a design is shown in U.S. Pat. No. 3,810,133, where a fine grained permalloy pattern is used to move bubble domains and an intersecting permalloy conductor is used to carry electrical current. Another patent showing the passage of electrical current through conductor lines and then through permalloy in U.S. Pat. No. 3,781,833. An all-permalloy current assisted disk generator is shown in P. K. George, IEEE Trans. on Magnetics, MAG-10, p. 1136, December, 1974.

In the design of complete magnetic bubble domain chips, it is often necessary to provide current carrying conductors in different portions of the magnetic chip. For example, such current carrying conductors are often used to assist the transfer of bubble domains from one shift register to another. In such transfer switches the non-magnetic conductor, typically gold, is located in a layer beneath the magnetic layer which provides the propagation elements which move the bubbles domains in response to the reorientation of a magnetic field in the plane of the magnetic layer. Copending application Ser. No. 863,829, filed Dec. 23, 1977, describes a process and structure in which a conductive layer is located beneath a magnetic layer and in which portions of the conductive layer are replaced by an electrically insulating material. In particular, this is done in the regions of the bubble detectors and generators.

In a bubble storage chip using a single high resolution masking level to define the magnetic layer and the non-magnetic current carrying conductors, the space between the bubble domain material and the magnetic drive layer is usually occupied by a non-magnetic conductor through which electrical current is passed for control of bubble transfer, generation, and replication. As bubble domain devices are scaled down so that higher densities can be obtained, it is necessary to reduce the distance between the bubble material and the magnetic drive layer, while maintaining the magnetic drive layer thickness approximately constant. An analysis of this is provided by G. S. Almasi et al in IEEE Transactions on Magnetics, MAG-12, p. 160 (1976). As a result of this, very high density bubble devices have spaces for conductor metallurgy between the bubble material and the magnetic drive layer which are thinner than the magnetic drive layer itself. Due to electromigration in current carrying materials, at some bit density it becomes possible to pass more current through the magnetic drive layer than through the conductor layer. Nevertheless, a conductor layer is generally desirable since it lowers the resistance of current carrying lines, thus reducing the power dissipation in the device. As an example, the resistivity of permalloy (NiFe) is approximately ten times that of gold.

As mentioned previously, the design of a complete magnetic bubble chip may require current carrying conductors under magnetic drive layers in certain regions of the chip. Heretofore, a good disk replicator has not been provided for use in such a magnetic chip. Accordingly, it is a primary object of the present invention to provide an improved replicate-type bubble generator having good margins, which can be manufactured by single masking level techniques, and which can be used in a magnetic chip having a non-magnetic conductor layer and a magnetic layer thereon.

It is another object of this invention to provide an improved current-controlled disk replicator which can be fabricated using single masking level processes and which exhibits good bias field and drive field margins, when used in a magnetic chip having two levels of metallurgy as described previously.

It is yet another object of the present invention to produce a magnetic storage chip characterized by a current carrying conductor layer located between a bubble domain material and a magnetic drive layer, where the magnetic chip includes a disk replicator which can be fabricated by a single level masking process.

It is a further object of the present invention to provide a single masking level disk replicator using an electrical current to assist splitting of a seed domain, which is particularly suited for the generation of bubble domains having diameters 2 microns and less.

It is a further object of the present invention to provide an improved disk replicator suitable for use in magnetic bubble chips having high density devices thereon, where operation of the disk replicator is not adversely affected by electromigration.

BRIEF SUMMARY OF THE INVENTION

This invention relates to a magnetic bubble domain chip having components thereon for generation, storage (propagation), transfer, detection, and annihilation of bubble domains, wherein an improved bubble domain generator of the disk replication type is provided. The disk is generally comprised of a magnetic material, typically a magnetically soft material such as permalloy, around which a seed domain moves as a magnetic drive field reorients in the plane of the magnetic material. During its movement, the seed domain is stretched and split into two parts, one of which remains on the disk and continues to be a seed domain for the generation of other domains. The other part is the newly generated domain which can be used elsewhere in the magnetic chip. The disk is sufficiently large that it holds the seed domain as the reorienting drive field recycles. The shape of the disk is generally square or rectangular, although other shapes can be used, and the thickness of the disk is generally equal to the thickness of the magnetic propagation elements used to move magnetic domains.

A current carrying conductor is used to provide a magnetic field which aids the splitting operation. This current carrying conductor comprises a portion of the disk itself. Thus, the underlying conductor metallurgy is present in most portions of the magnetic chip, except in the general area of the magnetic disk. This means that electrical current will pass through a portion of the magnetic disk during the splitting operation. Since the magnetic disk has a thickness such that a sufficient current density can pass through it without electromigration problems, the underlying conductive layer is not required in the area of the magnetic disk. Typically, the current carrying path through the magnetic disk is located along that edge of the disk closest to the region in which the domain is stretched from the disk to a nearby magnetic propagation element. This is termed the "leading edge", or "cutting edge" of the disk.

In practice, the conductor is a straight conductor without bends or hairpin loops and is narrow in the region of the disk. Typically, its width is about ($\frac{1}{2}$–$\frac{3}{4}$) of the bubble domain diameter in the area of the disk.

Thus, this magnetic chip is characterized by two layers of metallurgy produced by a single critical masking step. In the storage region of the magnetic chip, a conductor layer is located below the magnetic drive layer which provides the propagation elements for movement of domains. In the area of the transfer switches, this conductor layer is used to carry current for current-controlled transfer switches. However, in the area of the disk replicator, there is no conductor layer and an electrically insulating material takes its place. The thickness of this insulating material can be chosen so that the magnetic disk is close to the bubble material. This improves the drive field and bias field margins of the disk replicator. Also, most of the current that is used to assist the splitting operation passes through the conductive layer until it gets to the general area of the magnetic disk. It then flows through the magnetic disk and finally to another portion of the conductive layer where it completes its electrical circuit.

In contrast with prior art disk replicators, the present replicator is fabricated in a chip having a magnetic drive layer and a non-magnetic conductor layer and passes electrical current through the magnetic disk. Further, this is a disk replicator produced with only a single critical masking step. Still further, this disk replicator differs from all-permalloy replicators illustrated in the prior art, since it is part of a magnetic chip having a non-magnetic conductor layer beneath a magnetic drive layer, where portions of the conductor layer are used for current carrying functions.

These and other objects of the invention will be apparent from the following more particular description of the preferred embodiments.

BRIEF DESCRIPTION OF THE DRAWINGS

FIG. 1 is a top view of a bubble domain chip in accordance with the present invention, including the improved SLM disk replicator G of this invention.

FIG. 2A is a side elevation view of the magnetic chip of FIG. 1, taken along the line 2A—2A, while FIG. 2B is a side elevation view of a portion of the conductor C, taken along the line 2B—2B.

FIG. 3 is a diagram showing the incidence of a current pulse I through the generator G of FIG. 1, and in particular showing the phase relationship of this pulse with respect to the different orientations of the magnetic drive field H.

FIG. 7 is a margin plot of the bias field $H_b$ vs. the in-plane drive field H, for two different spacings between the generator G and the bubble domain film, and for 280 kHz operation of the device.

DETAILED DESCRIPTION OF THE PREFERRED EMBODIMENTS

Figure 4A:
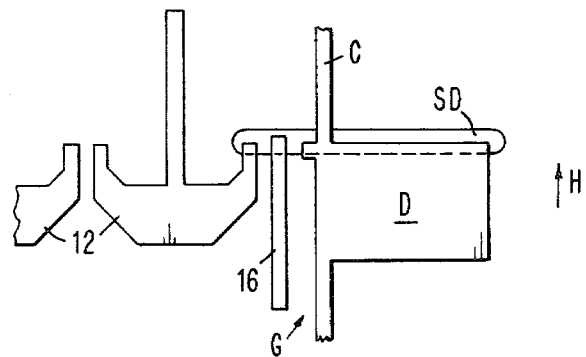
FIGS. 4A–4D illustrate the operation of the disk replicator G of FIG. 1.

FIG. 1 is a top view of a magnetic bubble domain chip, including both bubble propagation elements and a disk-replicator type of bubble domain generator G. Bubble domains exist in a bubble material included as a layer in a substrate 10, on which the propagation elements 12 and generator G are located. Propagation elements 12 are generally comprised of a magnetically soft material, such as permalloy (NiFe). Generator G includes a disk D and a conductor portion C which crosses the leading edge 14 of disk D. In areas of the chip remote from disk D, the conductor width widens, as illustrated in this drawing. Current I through conductor C is used to cut a seed domain stretched from disk D to I-bar 16. As will be more apparent, current I passes through the magnetically soft material comprising the disk D.

A magnetic bias field $H_b$ is directed normal to the plane of substrate 10 and is used to stabilize the diameter of bubble domains in the bubble domain film. A reorienting magnetic field H is used as the drive field for movement of bubble domains along the propagation elements 12 and for movement of the seed domain around the disk D. Bias field $H_b$ and drive field H are well known in the art and are provided by conventional circuits. Typically, field H is a rotating magnetic field which moves in a constant sense of rotation.

While disk D is generally larger than the propagation elements 12 used to move magnetic bubble domains, it is not necessary to do this. It has a shape and thickness such that it will continually retain a domain located on it during repeated cycles of the drive field. In this manner, it differs from the propagation elements 12, which will not retain a domain for repeated cycles of field H. Thus, the disk D can have any of a variety of sizes and shapes, such as round, square or rectangular as long as it will continually retain the seed domain. It has been found, however, that a rectangular disk is preferable as a generator, the thickness of the disk being equal to the thickness of the propagation elements 12 and the I-bar 16. Typically, the length of the disk is about 1.5 times its width.

Conductor C is a straight conductor preferably having no bends or hairpin loops therein. Its width in the area of the disk is generally about one-half to three-quarters of the bubble domain diameter. The lower limit on the width of the conductor C is determined by the limit at which electromigration due to current in the conductor becomes a problem. The upper limit on the width of the conductor is that at which the conductor becomes so wide that bubble domains have a tendency to stripe-out along the conductor length.

The conductor C is so located with respect to disk D that it lies along the leading edge 14 of the disk. Although the conductor need not be located exactly along leading edge 14, it has been found that this is preferable for good operating margins. As will be more fully apparent later, the current I in conductor C actually passes through the magnetically soft material comprising disk D. Thus, the conductor can be wider in regions away from the disk D, as illustrated in FIG. 1. The current carrying path is through a highly conductive material, such as gold, in regions of the conductor where it is wide, but in the region of the disk where the conductor is narrow, the current flow is through the disk material.

Since most of the current passes through the highly conductive gold layer where it has a wide cross-section, power consumption is reduced and the conductive layer carries the current with no electromigration problems. However, in the area of the generator G, the conductor must be narrow in order to prevent strip-out of bubbles along its length and in order to have the local magnetic field strength produced by current in the conductor as large as possible.

As noted above, the width of the conductor should be narrow in the region of the generator G, and the disk D should be located as close to the bubble material as possible. Therefore, if a conductor layer were located below the magnetic layer in the region of generator G, it would be narrow and thin, and would have a relatively poor current carrying capability. Because the magnetic layer is quite thick, its current carrying capability is actually greater than that of a thin narrow conductive material. Therefore, in the practice of this invention, the gold conductive layer has been eliminated in the region of the generator G, and current I is passed through the magnetic layer where the conductor is narrow, and also through the disk material.

FABRICATION (FIGS. 2A and 2B)

FIG. 2A is a side elevation view of the magnetic chip of FIG. 1, taken along the line 2A—2A. It illustrates the various metallurgical levels of the magnetic chip. The substrate 10 is comprised of a magnetic film 18 in which bubble domains can be generated and propagated, and a suitable layer 20 for supporting bubble film 18. Any type of bubble domain film can be used, including amorphous materials and those having garnet structures. In one example, the magnetic film 18 is a magnetic garnet, while supporting layer 20 is a non-magnetic garnet, such as GGG.

The propagation elements 12, I-bar 16, and magnetic disk D are portions of the same magnetic layer. In a preferred embodiment, the magnetic layer is permalloy.

A highly conductive layer 22 is located on bubble domain film 18. Layer 22 is located under the propagation elements 12 but is not present under the permalloy disk D. In FIG. 2A, conductive layer 22 is also not present under I-bar 16. Portions of conductive layer 22 are used for current carrying functions. For example, portions of this layer are used to carry current to effect a transfer of bubble domains from the propagation elements 12 to other propagation elements which are not shown in FIG. 1. In the region of the generator G, a layer 24 of an electrically insulating material is present and forms a "pedestal" on which the permalloy disk D is located. Typically, pedestal 24 is a material such as $SiO_x$.

FIG. 2B is a side elevational view of a portion of the conductor C. This illustrates that the conductive gold layer 22 is located below the magnetic material comprising the drive layer in those regions of conductor C where it is wide. When the width of conductor C diminishes to be narrow, the gold layer 22 is replaced by an electrically insulating material 24. Since the resistivity of gold is approximately 10 times less than that of permalloy, most of the current flow will be through layer 22 in the region where the conductor has a large width. In the region where the conductor is narrow, the thick permalloy layer has better electromigration resistance and the gold layer 22 is absent. Therefore all of the current flows through the magnetic drive layer, where the conductor is narrow.

OPERATION OF THE MAGNETIC CHIP (FIGS. 3 and 4A–4D)

The generator G operates to split the seed domain which is trapped on disk D, using a current pulse I through the conductor C. FIG. 3 shows the current pulse used for cutting a stretched seed domain. This cutting action occurs when the seed domain is stretched to both I-bar 16 and the adjacent propagation element 12, as will be more apparent in FIGS. 4A–4D.

The cutting current pulse is generally provided after phase 90° of the rotating drive field H. In this illustration, the cutting pulse duration is approximately 50°–60° of field H, although longer durations can be used, as will be explained with respect to FIGS. 8A and 8B.

FIGS. 4A–4D illustrate the operation of generator G. In FIG. 4A, a seed domain SD located on disk D has stretched to both I-bar 16 and adjacent propagation element 12, for the 90° phase of drive field H. For very small bubble domains, the magnitude of the bias field $H_b$ is very large. Although present designs of disk replicators will cause stretching of the seed domain from the disk to an adjacent I-bar when field H is parallel to the I-bar, as soon as field H rotates away from this direction the seed domain is often pulled off of the I-bar and back to the disk. Attempts to solve this problem by making the I-bar longer to increase its pole strength do not provide good solutions, since this causes the seed domain SD to be pulled off disk D. Accordingly, a current pulse through an associated conductor is used to aid cutting of the stretched seed domain. While this reduces the drive fields required for reliable replication over a wider range of bias field $H_b$, it does not provide a solution to the electromigration problem which occurs when bubble devices are designed for operations with very small bubble domains. In the present invention, passage of current through the permalloy disk D in the region of the generator G solves this problem.

Figure 4B:
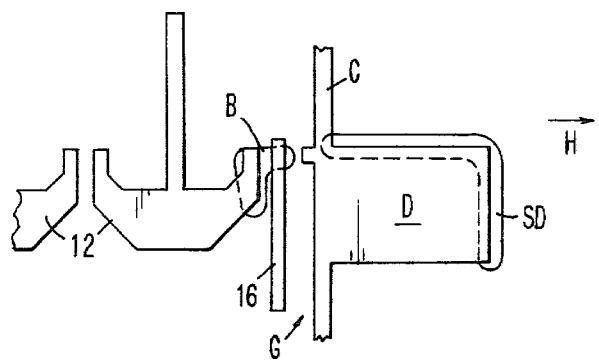

In FIG. 4B, field H has continued its clockwise rotation and is now directed to the right (180°). At a time corresponding to a direction of field H between those shown in FIGS. 4A and 4B, a current pulse I was present in conductor C to cause splitting of the stretched seed domain SD. This provides a new domain B which is shown as bridging the I-bar 16 and adjacent propagation element 12 in FIG. 4B.

Figure 4C:
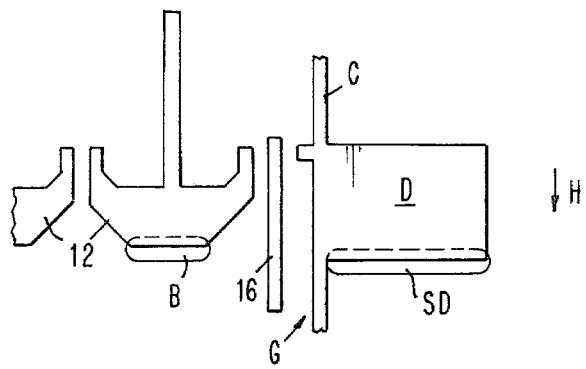

FIG. 4C shows the movement of domain B and seed domain SD as the field H continues to reorient. In this figure, H is directed downward (270°) and domain B has moved to the center of C-bar 12.

Figure 4D:
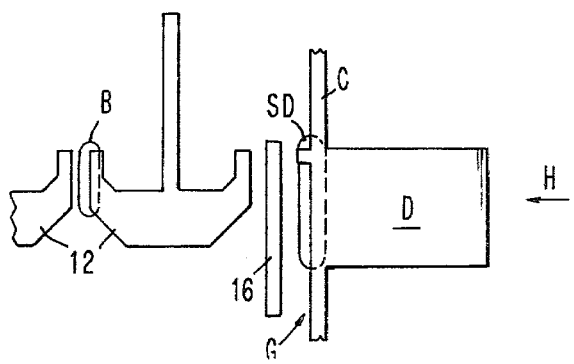

In FIG. 4D, new domain B has moved to the left-hand side of propagation element 12 and seed domain SD is still retained on the disk D. As field H continues its clockwise rotation, the sequence of events will be the same as that shown in FIG. 4A, when H is at phase 90°.

EXAMPLE

As shown in FIGS. 2A and 2B, the thickness of the electrically insulating layer 24 can be less than that of the surrounding gold layer 22. This enables the permalloy disk D to be close to the bubble film 18. In turn, this minimizes the magnitude needed for the drive field H, without reducing bias field margins.

In one embodiment of the present single level masking magnetic chip using two micron bubble domains, a 4,000 Angstrom thick spacer was used between bubble material 18 and a permalloy magnetic drive layer which was about 4,000 Angstroms thick. With linear scaling and 1 micron bubble domains, there would be space for at most 2,000 Angstroms of conductive layer 22 under the 4,000 Angstrom magnetic drive layer. Since gold and permalloy have about the same electromigration limits ($10^7$ A/cm$^2$) it would be advantageous to use the magnetic drive layer as the current carrying medium where the current carrying lines must be narrow. Further, for 0.5 micron bubble devices, this design would allow 10 ma current to be used in the generator, whereas only about 2.5 ma could be carried by a thin gold conductor. The thickness of the permalloy layer does not scale directly with bubble size, as pointed out by the aforementioned Almasi et al article.

FABRICATION (FIGS. 5A–5F)

As noted previously with respect to FIGS. 2A and 2B, this magnetic bubble domain chip is comprised of two layers of metallurgy. The layer closest to the bubble domain film is an electrically conductive material, such as gold, while the overlying level is a magnetically soft material, such as permalloy. All devices on the chip, including storage devices and transfer gates, have two layers of metallurgy, while in selected areas of the magnetic chip the underlying conductive layer is replaced by an electrically insulating layer. The generator of this invention is designed to be compatible with this type of magnetic chip, where two levels of metallurgy have to be provided by the same masking level.

Referring more particularly to FIGS. 5A–5F, the same reference numerals will be used as were used previously, whenever possible. Only when new fabrication levels are shown will new reference numerals be given.

Figure 5A:
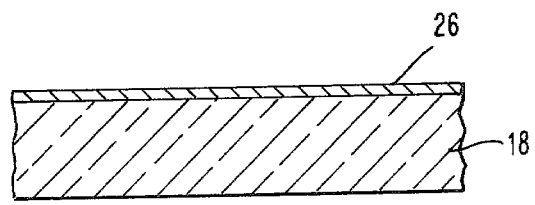
FIGS. 5A–5F illustrate a single level masking technique suitable for the fabrication of the magnetic chip of FIG. 1.

Accordingly, FIG. 5A shows a bubble domain film 18 having thereon a thin plating base layer 26. Layer 26 is generally a few hundred Angstroms in thickness and can be many different kinds of metal, including permalloy.

Figure 5B:
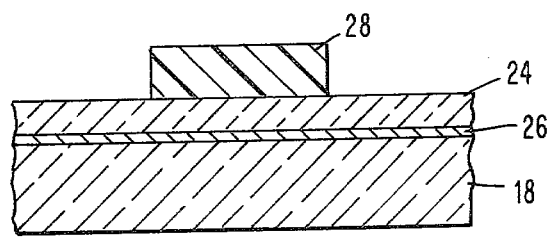
Figure 5C:
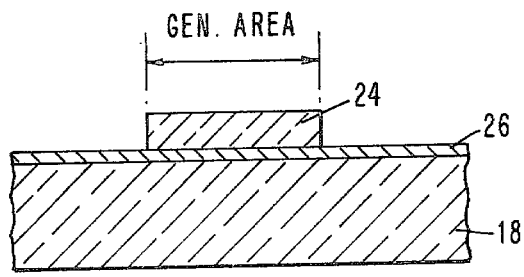

In FIG. 5B, an insulating layer 24 (such as SiO$_2$) is deposited to a thickness desired for magnetically optimum spacing of the disk generator to be later formed. That is, insulating layer 24 will be a spacing between the magnetic disk D (FIG. 1) and the underlying bubble material 18, so the thickness of layer 24 is set at that which will provide the desired magnetic coupling. It should be noted that insulating layer 24 is the same material as layer 24 shown in FIGS. 2A and 2B. Layer 24 is, for example, about 2,000–4,000 Angstroms thick if 2 micron bubbles are to be propagated. A patterned resist layer 28 is applied over layer 24. Using a crude masking process (large alignment tolerances), followed by a suitable etching step (chemical or ion beam), insulating layer 24 is removed everywhere except in the area where the generator is to be formed, as shown in FIG. 5C. Insulating pedestal 24 can also be provided in other parts of the magnetic chip, such as in the area of the sensors. The provision of insulating pedestals in portions of the magnetic chip is described more completely in copending application Ser. No. 863,829, filed Dec. 23, 1977, and assigned to the present assignee. The process described in FIGS. 5A–5F is the same as the process described in that copending application.

Insulating pedestal 24 can be considerably larger in lateral extent than the dimensions of the generator proper. Thus, it can extend to many propagation elements beyond the sensor, without adverse effects. As will be noted with respect to FIG. 5F, and also with respect to FIG. 2A, the insulating pedestal 24 extends laterally so that it is under both the disk D and the I-bar 16.

Figure 5D:
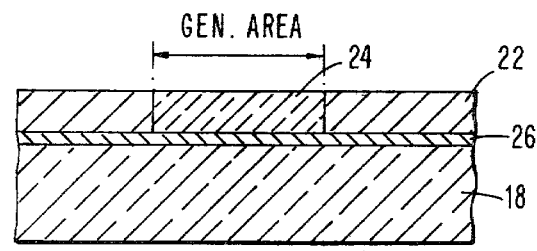

In FIG. 5D, the first level of metallurgy (the electrically conductive layer 22—see also FIG. 2A) is plated onto plating base layer 26. Plating continues until the conductive layer 22 has its height substantially equal to or greater than the height of the insulating pedestal 24.

Figure 5E:
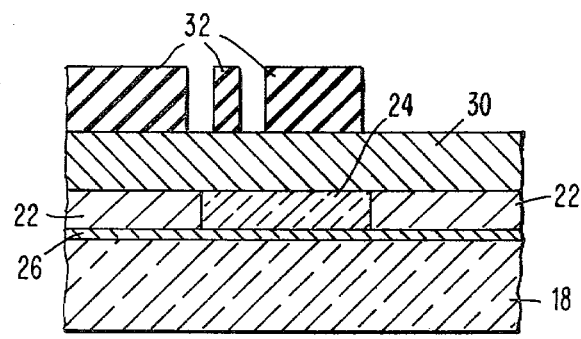

After this, a patterned magnetic layer is provided for formation of the magnetic propagation elements, such as elements 12 and 16 in FIG. 1 and the generator G. Either additive or subtractive processes, well known in the art, can be used for this purpose. For example, FIG. 5E shows the deposition of a continuous layer 30 of permalloy. Layer 30 will be patterned to provide the propagation elements and generator shown in FIG. 1. To do so, a resist layer is applied over layer 30, and is exposed and developed to make a mask 32. The underlying metallurgical layers are then etched through this resist mask to define the pattern of propagation elements, sensors, and conductors required in a complete magnetic bubble chip. This etching step also defines a conductor pattern in layer 22 and removes unwanted portions of plating base layer 26. Ion milling or sputter etching is an effective etching technique.

Figure 5F:
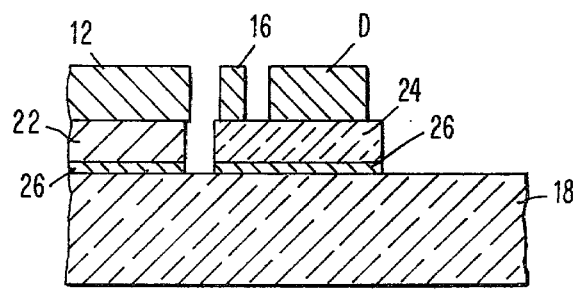

Thus, the structure of FIG. 5F is provided, which shows the portions of layer 30 used as propagation elements 12, I-bar 16, and generator disk D. As is apparent, disk D and I-bar 16 are located over the insulating pedestal 24, while propagation elements 12 are located on conductive layer 22. Conductive layer 22 is also located below the permalloy layer lying along the conductor C in FIG. 1, where the conductor has a wide cross-section. Thus, insulating pedestal 24 is provided in the general area of the generator G, and is present in those areas of conductor C where it is narrow. This forces the current flow through the thick permalloy layer in regions where the conductor is narrow, while allowing most of the electrical current to flow through the conductive layer 22 where the conductor is wide.

In FIGS. 5B and 5C, insulating layer 24 need not be etched all the way through to bubble film 10 if the conductive layer 22 is deposited by evaporation or sputtering. However, if plating is to be used, a plating base layer 26 has to be present. If a thin layer of insulating material is left, it can serve to protect the rest of the bubble film during the etching step which defines conductors in layer 22 and propagation elements in the overlying magnetic layer 30.

As will be noted, a two-level metallurgy magnetic chip is provided using only a single critical masking step to define the magnetic propagation elements and generators (and sensors) and also the various conductors used in the magnetic chip.

MARGIN PLOTS (FIGS. 6, 7, 8A and 8B)

Figure 6:
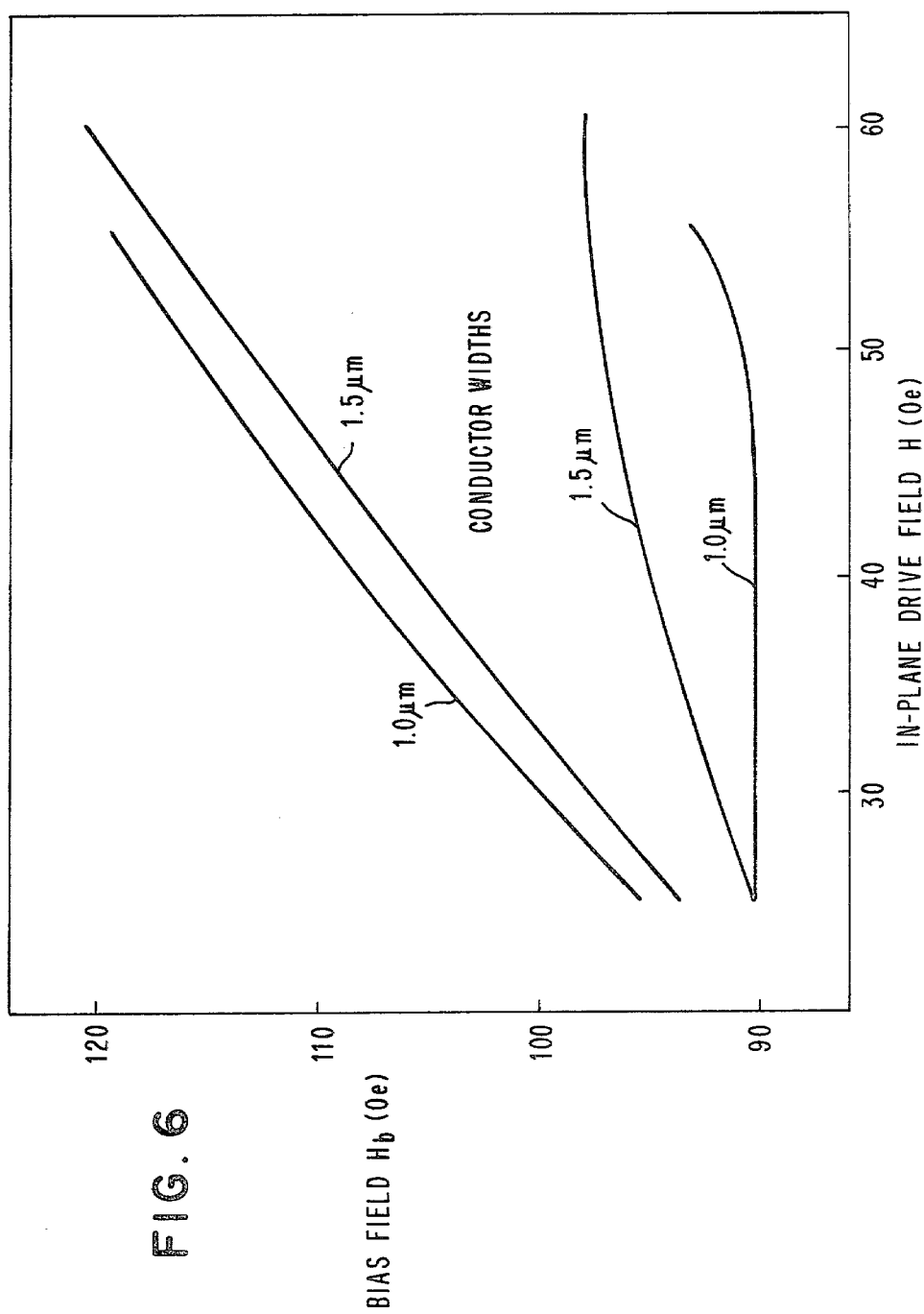
FIG. 6 is a margin plot of the bias field $H_b$ vs. the in-plane drive field H, for two widths of the conductor C (FIG. 1), and for 280 kHz operation of the generator.

FIGS. 6 and 7 plot the magnetic bias field $H_b$ versus the in-plane drive field H for a disk generator according to the present invention when operated at 280 kHz. In FIG. 6, these plots are made for two widths of the conductor C. As will be noted, the margins of operation of the generator G are better when the conductor width is 1 micron rather than 1.5 microns. In this plot, the magnetic bubble material was a garnet film having a formula $Eu_{0.7}Tm_{0.5}Y_{1.8}Ga_{0.85}Fe_{4.15}O_{12}$, and which supported magnetic bubble domains of diameter 2 microns.

The generator used for the margin plot of FIG. 6 had a conductor C located along the leading edge of the permalloy disk. This was a straight conductor without bends. Since the cutting field generated by the permalloy disk is at the leading edge of the disk, the contribution from the current in the conductor is maximum when the conductor is also located at the leading edge of the disk. If the conductor line position is farther away from the leading edge of the disk, higher current are required in the conductor to obtain margins equivalent to those shown in FIG. 6.

FIG. 7 is a margin plot for two thicknesses of the insulating spacer 24 (FIG. 2A). As is apparent from this plot, the margins for generator operation are greater when the insulating spacer is thin. This means that the permalloy disk D will be located closer to the bubble film, and smaller magnetic fields H will be required for movement of the seed domain around the disk. Since the height of the insulating pedestal can be arbitrarily set without regard to the thickness of the conductive layer 22, the margins of the generator can be adjusted in this way.

At low values of bias field $H_b$, the margin plots for the two spacer thicknesses follow the same curve. This corresponds to operation where the domains strip-out due to a low value of bias field.

The magnetic bubble film used to obtain the margin plot of FIG. 7 was a garnet film having the chemical formula $Eu_{0.7}Tm_{0.5}Y_{1.8}Ga_{0.85}Fe_{4.15}O_{12}$, which supported bubble domains of 2 microns diameter at a bias field of about 95 Oe.

Figure 8A:
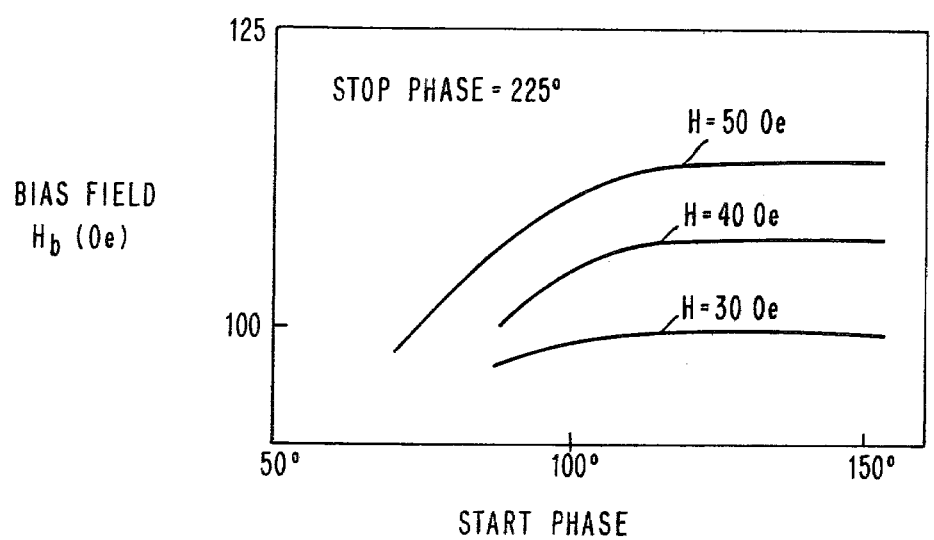
FIG. 8A is a margin plot of the generator of this invention, showing the dependence of the bias field $H_b$ on the start phase of the current pulse.
Figure 8B:
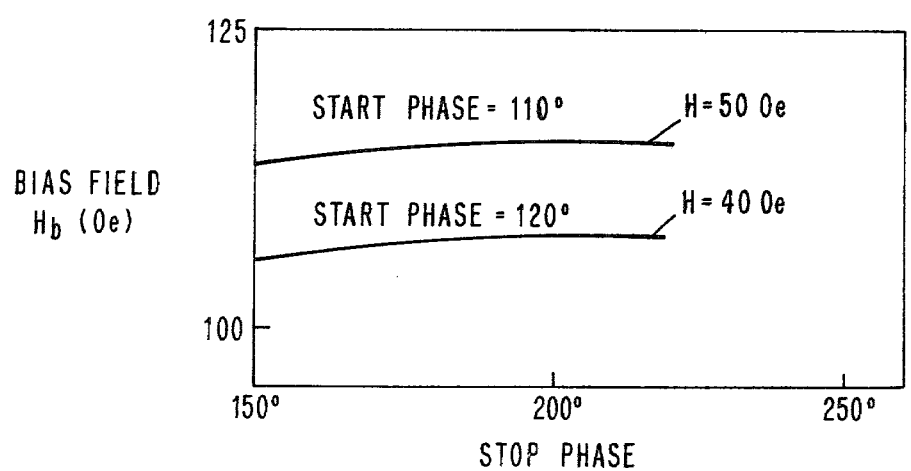
FIG. 8B is a margin plot of the generator of this invention, showing the dependence of the bias field $H_b$ on the stop phase of the current pulse.

FIGS. 8A and 8B illustrate the latitude with respect to the starting and stopping times of the cutting current pulse in the conductor C. These are margin plots of the bias field $H_b$ versus the start phase of the current pulse (FIG. 8A) and the bias field $H_b$ versus the stop phase of the current pulse (FIG. 8B).

In FIG. 8A, the current pulse is started at various phases of the field H, over a range of starting phases from approximately 70° to 150°. The current pulse is stopped at 225° regardless of the magnitude of the field H. Three curves are shown in this drawing for three different values of the drive field H.

As is apparent from FIG. 8A, the margins become better at a starting phase of at least about 90°. Thus, after about 90°, the curves are approximately horizontal for starting phases up to 150°. Since the stop phase for all current pulses shown in this plot is 225°, good margins are obtained with pulses having widths varying between about 135° and about 75°.

In FIG. 8B, the bias field margin is shown for different values of the stop phase at which the current pulse is terminated, for two different start phases and for two different values of the drive field. The top curve is the bias field margin when the start phase of the current pulse is 110° for a rotating drive field H of 50 Oe. The bottom curve is the margin plot for an electrical pulse started at 120° of rotation of the drive field, where the drive field has an amplitude of 40 Oe. From FIG. 8B, it is apparent that the bias field margin remains approximately constant for current pulses started at these two phases, over a wide range of stop phase for the current pulse.

The margin plots shown in FIGS. 8A and 8B were obtained with a disk replicator of the type shown in FIG. 1, using a magnetic bubble domain film having a garnet structure and a chemical formula given by $Eu_{0.7}Tm_{0.5}Y_{1.8}Ga_{0.85}Fe_{4.15}O_{12}$, which supported bubble domains of ~2 microns diameter.

From FIGS. 8A and 8B, it is apparent that, if the cutting current pulse is started after 90° (see FIG. 3), it can be turned off at almost any time without seriously affecting the bias field margins. Thus, while the cutting pulse in FIG. 3 is shown to have a duration of approximately 50°-60° of rotation of the drive field H, it is apparent from FIGS. 8A and 8B that the duration of this pulse can be substantially longer.

SUMMARY

What has been taught is a magnetic bubble domain chip generally having two layers of metallurgy. In the region of the generator, the conductive layer is replaced by an insulating pedestal of the type shown in aforementioned copending application Ser. No. 863,829. However, the teaching of the present invention is different from the teaching in that copending application, since a current controlled disk replicator is shown herein, where current flows through the disk in the region of the generator, but primarily flows through a conductive layer in regions remote from the disk replicator. Thus, the present invention is particularly directed to an improved disk replicator of the type to be used in a magnetic chip generally requiring two layers of metallurgy.

In the practice of this invention, it will be realized by those of skill in the art that the disk D can be provided from any suitable magnetic material and can have any selected geometry and thickness. Generally, the thickness is the same as that of the bubble propagation elements so that the disk and the propagation elements can be provided during the same fabrication step. The present disk replicator is a single level masking replicator whose fabrication is completely compatible with a single level masking technique used to provide all other portions of the magnetic chip.

While a fabrication process was described in which insulating pedestals were formed initially, the fabrication process can include the formation of the conductive layer as an initial step, followed by patterning of that conductive layer and deposition of insulating pedestals into apertures in the conductive layer.

While the present invention was described with reference to particular embodiments, those of skill in the art will be able to provide other embodiments based on the general teachings herein.

Having thus described my invention, what I claim as new, and desire to secure by Letters Patent is:

1. A magnetic bubble domain chip, comprising:
   a magnetic medium in which bubble domains can be generated and moved,
   a patterned first layer of magnetic material along which said bubble domains move in response to the reorientation of a magnetic field in the plane of said first layer,
   a patterned second layer of non-magnetic electrically conductive material located between said first layer and said magnetic medium,
   a replicate generator for splitting magnetic domains from a seed domain, said generator including a disk of magnetic material for holding said seed domain as said magnetic field reorients, said disk being a portion of said magnetic layer and having a leading edge from which said seed domain stretches as said magnetic field reorients,
   a current carrying conductor for carrying electrical current in a path along said leading edge of said disk, said conductor including in a first portion thereof said electrically conductive material and in a second portion thereof said magnetic layer, wherein said electrical current flows through said electrically conductive layer in said first portion and through said magnetic disk in said second portion.

2. The magnetic chip of claim 1, where said bubble domains have diameters less than about 2 microns.

3. The magnetic chip of claim 1, where said conductive layer is gold or AlCu and said magnetic layer is comprised of NiFe.

4. The magnetic chip of claim 1, including an electrically insulating material localized in the region of said magnetic disk and being located between said magnetic disk and said bubble domain medium.

5. The magnetic chip of claim 4, where the thickness of said insulating material is less than the thickness of said electrically conductive layer.

6. The magnetic chip of claim 1, wherein said magnetic disk has a rectangular shape, and said current carrying path in said disk lies along the leading edge of said disk.

7. The magnetic chip of claim 1, where said patterned first layer of magnetic material is patterned to form magnetic propagation elements which are separated from one another.

8. In a single high resolution level masking magnetic bubble domain chip including a magnetic medium in which bubble domains can be generated and moved, and including two non-coplanar levels of metallurgy defined by a single high resolution level of masking, the first of which is a layer of magnetic material having in-plane magnetization which is patterned to provide propagation elements along which bubble domains move in response to a magnetic field which reorients in the plane of said medium and the second of which is a layer of non-magnetic electrically conductive material which is patterned to provide current carrying conductors including transfer conductors for moving bubble domains from one shift register to another in said chip, said second layer being located between said bubble domain magnetic medium and said magnetic first layer, said first and second layers being patterned with a single level of masking, the improvement comprising:
   a replicate-type bubble domain generator including a seed domain holding means including a portion of said first layer of magnetic material for holding a seed domain thereon as said magnetic field reorients through continuous cycles,
   a current carrying path intersecting said seed domain holding means, said current path including a first portion thereof remote from said seed domain holding means comprised of said non-magnetic electrically conductive layer and said magnetic material layer and a second portion thereof which is said seed domain holding means, the primary path for electrical current in said first portion being through said non-magnetic electrically conductive layer and in said second portion being through said seed domain holding means, wherein said seed domain is stretched as said magnetic field reorients, a current pulse in said current carrying path producing a localized magnetic field which aids in splitting said seed domain when it is stretched.

9. The magnetic chip of claim 8, wherein said current path is along the edge of said seed domain holding means from which said seed domain is stretched.

10. The magnetic chip of claim 9, where said first portion of said current carrying path is in a region of said magnetic chip remote from said seed holding means, said current carrying path being wider in said first portion than it is in the close proximity of said seed holding means.

11. The magnetic chip of claim 10, where said conductor in the close proximity of said seed holding means has a width of approximately ($\frac{1}{2}-\frac{3}{4}$) of the diameter of said bubble domains.

12. The magnetic chip of claim 10, where said conductor in the close proximity of said seed holding means has a minimum width such that adverse electromigration does not occur as said current pulse passes through said magnetic material in said second portion of said current carrying path.

13. The magnetic chip of claim 8, where said seed holding means is a magnetically soft material.

14. The magnetic chip of claim 13, where said seed holding means is comprised of NiFe.

15. In a magnetic bubble domain chip including a magnetic medium in which bubble domains can be generated and moved, and including a first non-magnetic electrically conductive layer overlying said magnetic medium and a second layer of magnetic material overlying said first layer, said first layer being patterned to provide current carrying conductors and said second layer being patterned to provide propagation means for moving said bubble domains in response to the reorientation of a magnetic field in the plane of said second layer, the improvement comprising:
   a replicate-type bubble domain generator including a disk of magnetic material formed in a portion of said second layer, said disk having a geometry such that it will continuously hold a seed domain located thereon as said magnetic field reorients, a conductor for carrying electrical current to aid splitting of said seed domain in order to produce new bubble domains, said conductor being wide and having two levels of metallurgy in a first region of said magnetic chip remote from said disk, and having a narrow width and a single level of metallurgy in a second region of said magnetic chip including said disk, said conductor being separated from said magnetic bubble domain medium by a layer of electrically insulating material.

16. The magnetic chip of claim 15, where the two levels of metallurgy in the wide region of said conductor are said first layer of electrically conductive material and said second layer of magnetic material, the narrow region of said conductor including only said second layer of magnetic material, a portion thereof being said magnetic disk, wherein said current carrying path includes said electrically conductive layer in the first wide region of said conductor and said magnetic layer in the second narrow region of said conductor.

17. The magnetic chip of claim 16, where said bubble domains have diameters less than about 2 microns, and said first and second layers are patterned in the same masking level.

* * * * *